United States Patent [19]

Rote

[11] 4,048,718
[45] Sept. 20, 1977

[54] PIN CRIMPING APPARATUS AND PRODUCT THEREFROM

[75] Inventor: Everett Arthur Rote, Clay Canyon Camp, Calif.

[73] Assignee: Xerox Corporation, Stamford, Conn.

[21] Appl. No.: 635,549

[22] Filed: Nov. 26, 1975

[51] Int. Cl.² .......................... H05K 1/10; H05K 3/30
[52] U.S. Cl. ........................................ 29/739; 29/761; 339/17 LC
[58] Field of Search .......... 339/17 C, 17 LC, 17 LM, 339/17 M, 17 L, 75 MP, 276 R, 176 MP; 29/203 B, 203 D, 626, 739, 741, 761

[56] References Cited

U.S. PATENT DOCUMENTS

| 2,870,424 | 1/1959 | Franz | 339/17 L |
|---|---|---|---|
| 2,888,614 | 5/1959 | Barnes | 29/626 UX |
| 3,208,026 | 9/1965 | Ruehlemann | 339/17 LC |
| 3,230,493 | 1/1966 | Jensen et al. | 339/17 LC |
| 3,893,232 | 7/1975 | Fletcher | 29/203 B X |

Primary Examiner—Roy Lake
Assistant Examiner—E. F. Desmond
Attorney, Agent, or Firm—James J. Ralabate; Franklyn C. Weiss; Anthony W. Karambelas

[57] ABSTRACT

This invention relates to a printed circuit mother board with card holders attached thereto by means of card holder pins extending through apertures in the mother board, the pins being uniformly crimped to hold them securely for presentation to a solder wave and a machine for producing such a product.

2 Claims, 5 Drawing Figures

PIN CRIMPING APPARATUS AND PRODUCT THEREFROM

In the printed circuit board technology, mother boards are often utilized. Mother boards are printed circuit boards with conductive elements in circuit array and having aligned apertures in association with the conductive circuit elements. The apertures are adapted to receive deformable pins of card holders. The conductive pins of the card holders are electrically coupled with the circuit elements of the board while the card holders are adapted to physically hold and electrically couple the mother board electrical elements to the electrical elements of the printed circuit boards supported in the card holders. In the construction of the composition product of the mother boards and the card holders it has been necessary to insert the pins of the card holders through apertures in the mother board and then preliminarily join the two in rigid configuration. This joining of the pins of the card holders to the mother board is done by manual insertion of the pins and manually bending a selected number of pins to the mother board by bending of about 90°. This product may then be made permanent by contacting the pin side of the mother board with a solder wave to bond each pin into each hole and thus make the product rigid and receptive to additional printed circuit boards.

The existing practice for carrying out this step has included the manual insertion of all the pins of the card holder through the aligned apertures of the mother board whereafter an operator would manually bend a preselected number, preferably six pins. Automatic bonding of all the pins to all the holes of the mother board could then take place. In such an operation a skilled operator is needed since only certain predetermined pins may be bent. If improper pins were bent, to about the normal 90°, they could extend to and contact conductive segments of the mother board to short or otherwise destroy the intended electronic operation of the assembly.

It is considered that this manual technique can be replaced by a technique to prepare the intermediate product for movement through a solder wave. According to the present invention, all, rather than some, of the pins are uniformly deformed outwardly from the centerline of the card holder to a predetermined amount as for example 30°. The rigidity of this unsoldered assembly permits it to be conveniently presented to a solder wave with rigidity equal to or better than that of the old manual method. It can also be done in a much faster time span and with greater accuracy and without the need of skilled pin benders.

This product is generated through a machine including a conveyor which moves the mother board and undeformed pins of the card holder into contact with free floating crimping wheels deform all of the card holder pins uniformly and automatically with a single pass It is therefore an object of the instant invention to generate a product including mother boards with associated card holders with the pins of the card holders uniformly deformed to maintain the composite product rigid for presentation to a solder wave.

It is further object of the instant invention to cheaply and rapidly deform pins of card holders extending through apertures of a printed circuit mother board to hold the composite product in a firm configuration.

A further object of the instant invention is a machine to generate the product comprising rigidly held card holders with pins angled to support it in a desired orientation onto a printed circuit mother board.

These and other objects of the instant invention are achieved in the product, and machine for producing that product, as described herein and will become apparent when the instant disclosure is read in association with the attached drawings wherein:

FIG. 1 discloses a mother board and card holders with their pins deformed for presentation to a solder wave.

Figure 1:
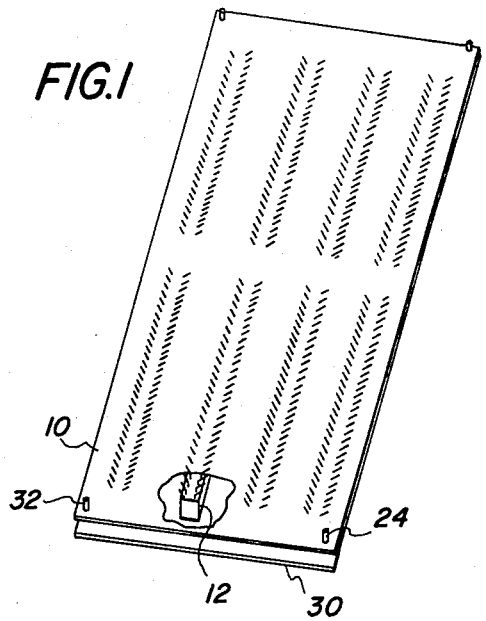
Figure 2:
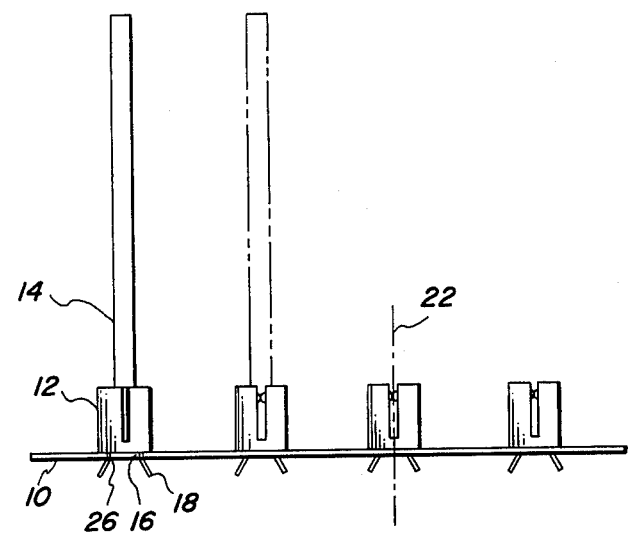
FIG. 2 is an end view of the card holders and mother board of FIG. 1 with one printed circuit board attached.

Shown in the drawings is a circuit board 10 which constitutes the mother board upon which card holders 12 are to be mounted for supporting printed circuit boards 14. Holes 16 are performed in the mother board for receiving pins 18 of the card holders. As is well known in the art, conductive elements are formed on the mother board as well as the printed circuit boards held in the card holders for carrying out the electronic operations of the assembly. Pins 18 of the card holders 12 extend through holes 16 for mechanically and electrically coupling the various elements of the assembly.

Also located on the mother board are apertures 24 for mounting and aligning the mother board and the constituent assembly within the electronic machine wherein the assembly of various printed circuit members are to be utilized.

In operation, it is desired to form spot solderings, at the junction of the pins of the card holders to the holds of the mother board as at 26 to assure good mechanical and electrical contact and rigidity. This is normally done by placing the mother board, with the card holder pins extending downwardly whereby a machine may provide a wave of liquid solder for generating this coupling.

In order to provide a sufficiently rigid to temporarily couple the card holder to the mother board until the solder wave operation can be performed, it has been traditional to bend a plurality of the pins to about 90° by a manual operation. In carrying out such manual operation it is important that an operator bend the pins in such direction as to not overlap the conductive sections appearing on the adjacent face of the mother board. As can be understood, some of the pins may be bent in only one direction. Others may only be bent in other direction, or both directions. Yet, others of the pins may not be bent at all without interfering with the appropriate electrical operation of the assembly. As a result, only skilled operators may be used for the manual bending function. And even so, chances for rejects exist.

The present invention contemplates bending all the pins slightly and outwardly, as for example 30°, from the vertical centerline 22 of the card holder prior to presenting the assembly to a solder wave.

Figure 3:
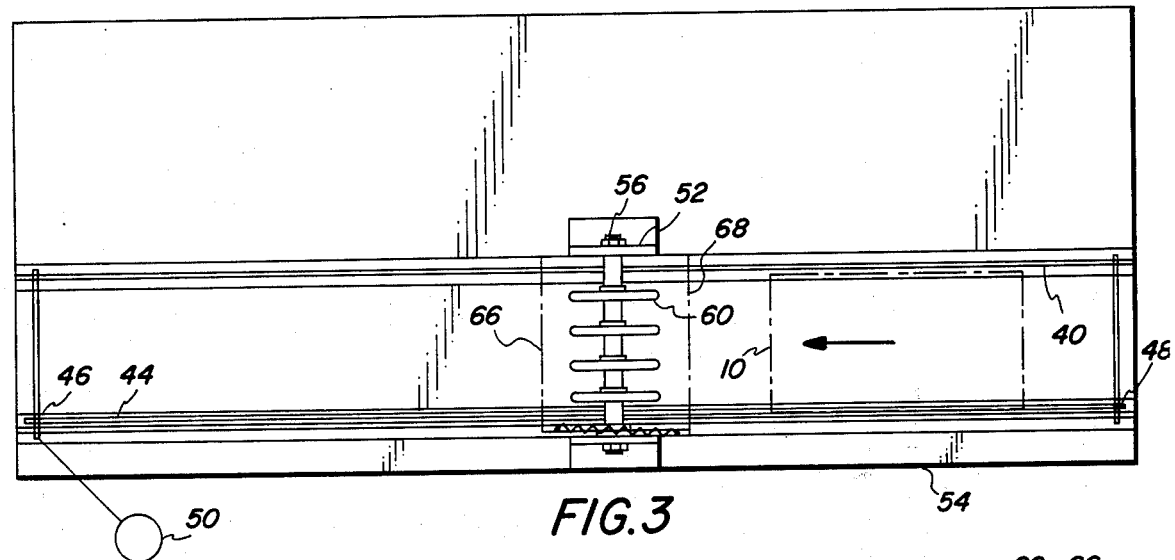
FIGS. 3, 4 and 5 are plan, side and elevational drawings of the machine for generating the product of FIGS. 1 and 2.
Figure 4:
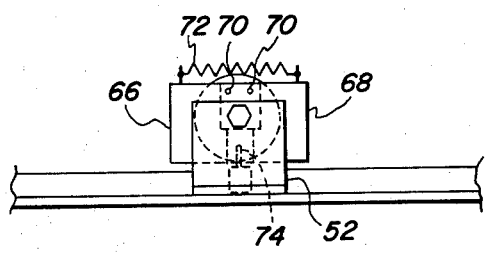
Figure 5:
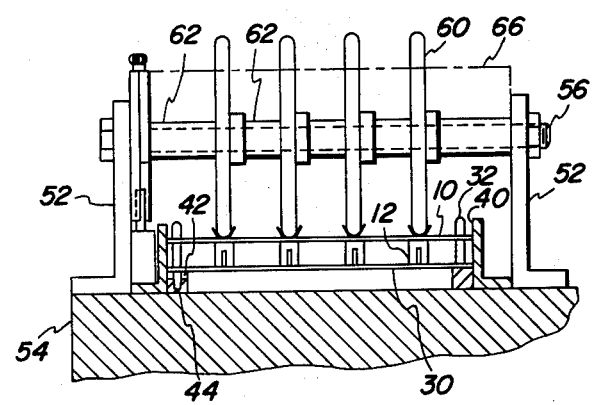

This operation can be achieved, and the product generated, very efficiently through the machine as shown in FIGS. 3, 4 and 5. In order to utilize such machine, however, it is necessary to utilize a support board 30 having upstanding pins 32 which mate with apertures 24 on the mother board. In this fashion the support board may be mounted into the mother board with the pins of the card holders first extending downwardly. The formed sandwich may then be inverted as shown in FIGS. 1 and 5 to have the pins extend upwardly so that the card holders do not gravity drop from the mother board. Rather, they are held firmly with their top free faces being pressed against the support board and their lower faces firmly pressed against the mother board. With this sandwich arrangement being constructed it may be then placed on the conveyor mechanism of the pin crimping machine with its pins extending upwardly and its side edges extending within inner brackets 40.

In this arrangement a lower protuberance 42 from the support board 30 may contact a rotating chain 44 mounted adjacent the inner bracket 40 on sprockets 46 and 48. Motor 50 provides motive power for the chain to drive it and the circuit board sandwich along the length of the machine in the direction of the arrow although it could be fed in either direction. Exterior brackets 52 located preferably central of the main table 54 supports a support shaft 56 upon which are mounted crimping wheels 60. The crimping wheels are apertured for mounting on the support rod and positioned by virtue of removable collars 62.

The crimping wheels are freely floating for rotation and may be arranged so that they align with the centerline of the pins of the card holders to the crimped. The height of the support rod and crimping wheels is such that as a printed circuit board sandwich is located at one end of the table and moved to the opposite end of the table by the motion of the motor, sprockets and chain, the inboard pins will first contact the crimping wheel at their extremities and be deformed in outwardly fashion to about 30° as they pass into and out of contact with the curved surface of the wheels. Further, movement of the mother board and rows of card holder pins will crimp all of the contacted pins of the card holder appropriately.

The support rod 56 may be provided with any number of crimp wheels 60 corresponding to the appropriate number of columns of card holders 12 on any particular mother board. Further, the spacing of the crimp wheels may be readily done through the adjustment collars on the support rod to tailor the machine to the particular job to be done. Repositioning the crimping wheels and collars for other runs is thus easily accomplished.

While there are no driven parts associated with the support rod and crimping wheels it is naturally desired to provide maximum safety in this as well as any other machine. This is done by safety guards 66 and 68, shown in FIG. 4 only for clarity, preferably formed of a transparent plastic material, which are mounted on the support bracket 52 by pivot pins 70. These devices are pivotally mounted and resiliently held in position for safe operation by spring 72 whereby the safety guards will deflect inwardly in case of an undesired object such as an operator's hand moving with the sandwich into the crimp wheel area. In such instance switch 74 will be actuated for sending such warning signal to the circuitry of the drive motor to inactivate the drive to the motor, sprocket and chain.

As the sandwich exists from beyond the safety guard having passed the crimp wheels the support board may be removed so that the end product, the mother board with crimped pins of the card holders holding the package in sufficient rigidity whereby it may be presented to a solder wave for generation of the final end product.

In addition to ease of assembly, the instant invention creates a desirable ease of disassembly. More specifically, in the past, after solder wave joining of card holders to mother boards, if a defect was noticed and salvage of the elements was required, manual unbending of the manually bent pins was necessary after melting of the solder to separate the card holders from the mother board. In the new technique, this manual unbending may now be eliminated since heating of the entire board and physical separation of the entire card holder is all that is required.

While the instant invention has been described as being carried out with a particular machine, and in a particular product generated from such machine, it is not intended that the instant invention be so limited but that it be broadly covered within the scope of the appended claims.

What is claimed is:

1. A machine for crimping pins of card holders extending through apertures in a printed circuit mother board including:
    movable support means for supporting the mother board with the pins, through apertures in the mother board, of a card holder extending upwardly in vertical rows,
    crimping wheels operatively positioned with the support means to contact the pins and outwardly deform the card holder pins when they are moved into contact and past said wheels, and
    means to move said support means and supported mother boards past said wheels so that when the mother boards and pins means are contacted by and moved past said crimp wheels they will be deformed outwardly to render the pins and card holders relatively secure for presentation to a solder wave.

2. The machine is set forth in claim 1 wherein said crimping wheels are free floating on a support shaft.

* * * * *